US007913218B2

(12) United States Patent
Baumgartner et al.

(10) Patent No.: US 7,913,218 B2
(45) Date of Patent: *Mar. 22, 2011

(54) REDUCTION OF XOR/XNOR SUBEXPRESSIONS IN STRUCTURAL DESIGN REPRESENTATIONS

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 631 days.

This patent is subject to a terminal disclaimer.

(21) Appl. No.: 11/955,152

(22) Filed: Dec. 12, 2007

(65) Prior Publication Data

US 2008/0091386 A1    Apr. 17, 2008

Related U.S. Application Data

(63) Continuation of application No. 11/086,720, filed on Mar. 22, 2005, now Pat. No. 7,340,694.

(51) Int. Cl.
*G06F 17/50* (2006.01)
(52) U.S. Cl. ......... 716/132; 716/101; 716/116; 716/119
(58) Field of Classification Search .................. 716/101, 716/116, 119, 132
See application file for complete search history.

(56) References Cited

U.S. PATENT DOCUMENTS 6,128,110 A * 10/2000 Bulow .......................... 359/108
7,143,376 B1 * 11/2006 Eccles .............................. 716/5

OTHER PUBLICATIONS

R. Rudell et al., "Espresso-MV Algorithms for Multiple-Valued Logic Minimization", article, 1985, pp. 230-233, Dept. of Electrical Engineering & Computer Sciences, University of California, Berkeley, CA, USA.

* cited by examiner

*Primary Examiner* — Thuan Do
(74) *Attorney, Agent, or Firm* — Dillon & Yudell LLP

(57) ABSTRACT

A method, system and computer program product for reducing XOR/XNOR subexpressions in structural design representations are disclosed. The method includes receiving an initial design, in which the initial design represents an electronic circuit containing an XOR gate. A first simplification mode for the initial design is selected from a set of applicable simplification modes, wherein the first simplification mode is an XOR/XNOR simplification mode, and a simplification of the initial design is performed according to the first simplification mode to generate a reduced design containing a reduced number of XOR gates. Whether a size of the reduced design is less than a size of the initial design is determined, and, in response to determining that the size of the reduced design is less than a the size of the initial design, the initial design is replaced with the reduced design.

18 Claims, 2 Drawing Sheets

REDUCTION OF XOR/XNOR SUBEXPRESSIONS IN STRUCTURAL DESIGN REPRESENTATIONS

PRIORITY CLAIM

The present application is a continuation of U.S. patent application Ser. No. 11/086,720, filed on Mar. 22, 2005, now U.S. Pat. No. 7,340,694 and entitled, "Method and System for Reduction of XOR/XNOR Subexpressions in Structural Design Representations," which is incorporated herein by reference.

CROSS-REFERENCE TO RELATED APPLICATIONS

The present application is related to the following co-pending U.S. patent applications filed on even date herewith, and incorporated herein by reference in their entirety:

Ser. No. 11/086,721 (AUS920050017US1), entitled "METHOD AND SYSTEM FOR REDUCTION OF AND/OR SUBEXPRESSIONS IN STRUCTURAL DESIGN REPRESENTATIONS".

BACKGROUND OF THE INVENTION

1. Technical Field

The present invention relates in general to verifying designs and in particular to performing reduction of subexpressions. Still more particularly, the present invention relates to a system, method and computer program product for performing reduction of XOR and XNOR subexpressions in structural design representations.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process.

Among the available verification techniques, formal and semiformal verification techniques are powerful tools for the construction of correct logic designs. Formal and semiformal verification techniques offer the opportunity to expose some of the probabilistically uncommon scenarios that may result in a functional design failure, and frequently offer the opportunity to prove that the design is correct (i.e., that no failing scenario exists).

Unfortunately, the resources needed for formal verification, or any verification, of designs are proportional to design size. Formal verification techniques require computational resources which are exponential with respect to the design under test. Simulation scales polynomially and emulators are gated in their capacity by design size and maximum logic depth. Semi-formal verification techniques leverage formal algorithms on larger designs by applying them only in a resource-bounded manner, though at the expense of incomplete verification coverage. Generally, coverage decreases as design size increases.

Techniques for reducing the size of a design representation have become critical in numerous applications. Logic synthesis optimization techniques are employed to attempt to render smaller designs to enhance chip fabrication processes.

Numerous techniques have been proposed for reducing the size of a structural design representation. For example, redundancy removal techniques attempt to identify gates in the design which have the same function, and merge one onto the other. Such techniques tend to rely upon binary decision diagram (BDD)-based or satisfiability (SAT)-based analysis to prove redundancy, which tend to be computationally expensive. Another technique is subexpression elimination, wherein a system rewrites logic expressions to attempt to enable a representation with fewer gates. For example, given two expressions A&B&C and D&A&B, subexpression elimination would translate those to (A&B)&C and (A&B)&D, enabling a sharing of node (A&B) between both expressions, requiring a total of three 2-bit AND expressions vs. four. Traditionally, such subexpression elimination algorithms require the use of logic factoring algorithms for obtaining covers of expanded forms of logic expressions, which also tend to be costly in terms of computational resources. Similar subexpression elimination algorithms are needed for XOR and XNOR subexpressions.

What is needed is a method, system, and computer program product for heuristic XOR and XNOR subexpression elimination on a structural design representation.

SUMMARY OF THE INVENTION

A method, system and computer program product for reducing XOR/XNOR subexpressions in structural design representations are disclosed. The method comprises receiving an initial design, in which the initial design represents an electronic circuit containing an XOR gate. A first simplification mode for the initial design is selected from a set of applicable simplification modes, wherein the first simplification mode is an XOR/XNOR simplification mode, and a simplification of the initial design is performed according to the first simplification mode to generate a reduced design containing a reduced number of XOR gates. Whether a size of the reduced design is less than a size of the initial design is determined, and, in response to determining that the size of the reduced design is less than a the size of the initial design, the initial design is replaced with the reduced design.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a method, system, and computer program product for subexpression elimination in a structural design representation. The present invention uses polynomial structural algorithms, discussed below, and is robust in the sense that it does not increase design size. The present invention may also be configured to preserve as much of the original design representation as possible. The present invention increases verification speed (due to operation upon structural design representations without a need for expanding logic expressions, or SAT or BDD-based analysis), and is applicable to very large designs. Under the prior art, in very large and complex combinational equivalence checking examples, software packages cannot feasibly expand the expression of the cone under evaluation to utilize subexpression elimination techniques. The present invention heuristically enables subexpression elimination "deep" in logic cones.

Figure 1:
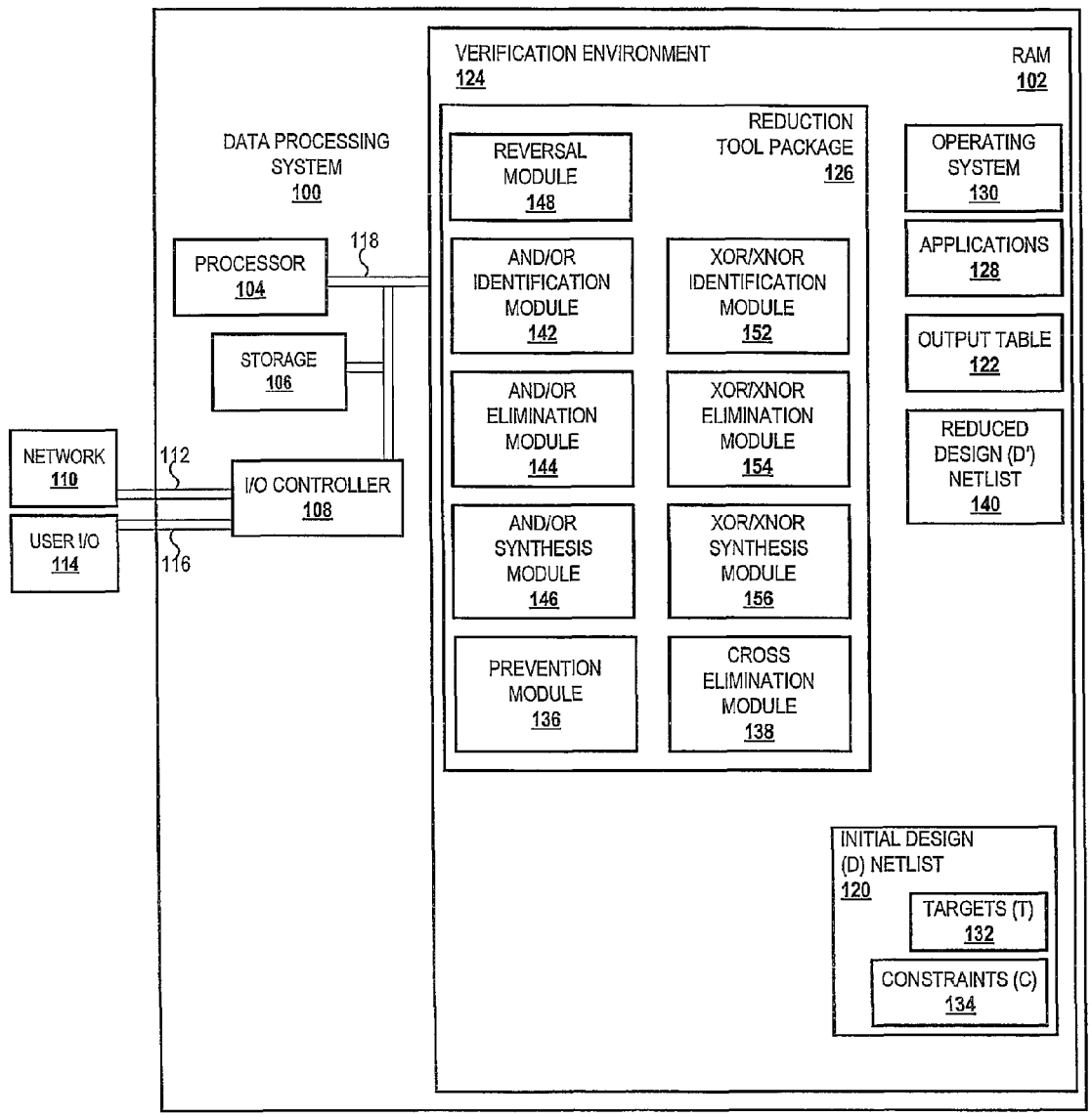
FIG. 1 depicts a block diagram of a general-purpose data processing system with which the present invention of a method, system and computer program product for performing reduction of subexpressions in structural design representations containing XOR and XNOR gates may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include an initial design (D) netlist 120 and an output table 122 for interaction with a verification environment 124. In the embodiment shown in FIG. 1, initial design (D) netlist 120 contains targets (T) 132 and constraints (C) 134. Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include reduced design (D') netlist 140.

A netlist graph, such as design (D) netlist 120, is a popular means of compactly representing problems derived from circuit structures in computer-aided design of digital circuits. Such a representation is non-canonical and offers the ability to analyze the function from the nodes in the graph. A netlist, such as initial design (D) netlist 120, contains a directed graph with vertices representing gates and edges representing interconnections between those gates. The gates have associated functions, such as constants, primary inputs (e.g. RANDOM gates), combinational logic (e.g., AND gates), and sequential elements (hereafter referred to as registers). Registers have two associated components; their next-state functions and their initial-value functions, which are represented as other gates in the graph. Certain gates in the netlist may be labeled as "primary outputs", "targets", "constraints", etc.

Semantically, for a given register, the value appearing at its initial-value gate at time "0" ("initialization" or "reset" time) will be applied by verification environment 124 as the value of the register itself; the value appearing at its next-state function gate at time "i" will be applied to the register itself at time "i+1". Certain gates are labeled as targets (T) 132 and/or constraints (C) 134. Targets (T) 132 correlate to the properties that require verification. Constraints (C) 134 are used to artificially limit the stimulus that can be applied to the RANDOM gates of initial design (D) netlist 120; in particular, when searching for a way to drive a "1" to a target (T) 132, the verification environment 124 must adhere to rules such as, for purpose of example, that "every constraint gate must evaluate to a logical 1 for every time-step" or "every constraint gate must evaluate to a logical 1 for every time-step up to, and including, the time-step at which the target is asserted." For example, in verification environment 124, a constraint could be added which drives a 1 exactly when a vector evaluates a set of RANDOM gates to simulate even parity. Without its constraint, the verification environment 124 would consider valuations with even or off parity to those RANDOM gates; with the constraint, only even parity would be explored. The present invention will, with respect to some designs, preserve the expression of some targets (T) 132 and constraints (C) 134.

Processor 104 executes instructions from programs, often stored in RAM 102, in the course of performing the present invention. In a preferred embodiment of the present invention, processor 104 executes verification environment 124.

In a preferred embodiment, the present invention is applied to a netlist representation where the only combinational gate type is a 2-input AND, and inverters are represented implicitly as edge attributes. Registers have two associated components, their next-state functions, and their initial-value functions. Both are represented as other gates in design (D) netlist 120. Semantically, for a given register, the value appearing at its initial-value gate at time '0' ("initialization" or "reset" time) will be applied as the value of the register itself; the value appearing at its next-state function gate at time "i" will be applied to the register itself at time "i+1". Certain gates are labeled as "targets" and/or "constraints".

Hereafter, the explanation of the present invention assumes that OR gates are represented as AND gates with inversion attributes pushed on all their incoming edges and outgoing edges, and INVERTER gates are folded into inverted attributes on edges between their source and sink gates. The implementation in the preferred embodiment of this assumption increases the power of the present invention by "shifting" to an alternate logic representation. In a 2-input AND representation, note that A XOR B may be represented either as (NOT (A & NOT B) & NOT (NOT A & B)) or (NOT (A & B) & NOT (NOT A & NOT B)). XNOR toggles the top level inversion.

Targets (T) 132 represent nodes whose Boolean expressions are of interest and need to be computed. The goal of the verification process is to find a way to drive a '1' on a target (T) 132 node, or to prove that no such assertion of the target (T) 132 is possible. In the former case, a "counterexample trace" showing the sequence of assignments to the inputs in every cycle leading up to the fail event getting triggered is generated and recorded to output table 122.

Verification environment 124 includes a computer program product, stored in RAM 102 and executed on processor 104, which provides a series of tools for activities such as equivalence checking, property checking, logic synthesis and false-paths analysis. Generally speaking, verification environment 124 contains rule-based instructions for predicting the behavior of logically modeled items of hardware.

Verification environment 124 uses the series of rules contained in its own instructions, in conjunction with design netlist 120, to represent the underlying logical problem structurally (as a circuit graph). In a preferred embodiment, verification environment 124 includes a Cycle-Based Symbolic Simulator (CBSS), which performs a cycle-by-cycle simulation on design netlist 120 symbolically by applying unique random, or non-deterministic, variables to the netlist inputs in every cycle. In order to reduce the size of designs on which it operates, such as initial design (D) netlist 120, verification environment 124 includes a reduction tool package 126.

A Cycle-Based Symbolic Simulator (CBSS), such as is included verification environment 124, performs a cycle-by-cycle symbolic simulation on a netlist representation of the design in initial design (D) netlist 120. Verification environment 124 extends the cycle simulation methodology to symbolic values. Verification environment 124 applies symbolic functions to the inputs in every cycle and propagates them to the targets 132. Hence, state-variables/next-state functions and the targets are expressed in terms of the symbolic values applied in the various cycles. If a target is hit, a counterexample may generated simply by assigning concrete values to the symbolic values in the cycles leading up to the failure.

Reduction tool package 126 is comprised of several tools, which one skilled in the art will quickly realize may be embodied as separate units or as lines of code within an integrated package.

An AND/OR identification module 142 identifies certain gates initial design (D) netlist 120 (referred to as "roots") whose functions must be preserved when eliminating common subexpressions within AND/OR trees, which in turn indicate which gates may be replaced by the process of the present invention. AND/OR identification module 142 identifies AND roots in four steps. First, AND/OR identification module 142 labels all pre-defined gates whose functions need to be preserved as roots. For example, in a verification setting, targets (T) 132 and constraints (C) 134 may need to be preserved. Similarly, in a synthesis setting, "primary outputs" may need to be preserved. Second, AND/OR identification module 142 marks the "cone of influence" of the pre-defined gates. The cone-of-influence is identified transitively as the set of gates which source incoming edges to this pre-defined set, including next-state functions and initial-value functions for registers. Third, for any register marked as in the cone-of-influence, AND/OR identification module 142 labels its next-state function and initial-value function as roots. Finally, for any non-register gate "g" in the cone-of-influence, the AND/OR identification module 142 analyzes all gates that source the incoming edges to "g". If "g" is not an AND gate, AND/OR identification module 142 tags all such source gates as roots. Otherwise, for each incoming edge, if that edge is tagged as "inverted", AND/OR identification module 142 marks the corresponding source gate as a root.

AND/OR elimination module 144 executes a heuristically optimal structural algorithm for eliminating common AND/OR subexpressions from the identified roots. For all AND-gate roots tagged by AND/OR identification module 142, AND/OR elimination module 144 traverses fanin-wise exclusively through AND gates and uninverted edges, queueing up "leaves" of the AND tree as all "edges" at which the traversal stops (where an "edge" correlates to both the source gate and the "inverted" attribute of the edge). These edges will include either inverted edges (sourced by arbitrary gate types), or uninverted edges to non-AND gate types. Any gates traversed "through" which are not marked as roots will effectively be replaced by subexpression elimination process, as explained later.

AND/OR elimination module 144 then builds an intermediate data structure representing the common subexpression data. AND/OR elimination module 144 ignores any gate not marked in the cone of influence identified by AND/OR identification module 142. For any AND gate marked as a root, AND/OR elimination module 144 translates it as a multi-input gate (of the same function) in the intermediate representation whose inputs are the identified leaves. The resulting netlist will include all AND gate roots, and all gates queued up as literals for those roots, with edges between them. AND/OR elimination module 144 then eliminates subexpressions from the created data structure via the algorithm embodied in the following pseudocode:

```
for each gate "i" which is a literal of an AND root{
    for each polarity of "i", i.e. for each literal "j" involving "i" {
// the present invention will check for instances of "i" as well as "NOT i" in roots
        roots = all AND gate roots in the fanout of "j"
// the roots including literal "j" that the present invention may refactor from
        if (roots has fewer than two elements) {continue;}
// no subexpression elimination possible with "j"
        leaves = all literals occurring in 2+ roots
// the literals that the present invention may refactor out of roots; this will include j
        leaves = leaves MINUS "j"
// leaves is now the set of literals that the present invention will try to refactor of roots, along with j
        while (leaves) {
            "k" = pop (leaves)
// grab another literal; the present invention will try to refactor both "j" and "k" out of roots
            roots' = subset of roots containing {"j", "k"}
// see which roots include both "j" and "k"
            if (roots' has fewer than two elements) {continue;}
// a small optimization - due to adding newly created AND gates as roots below
            leaves' = maximal set of common literals in each element of roots'
// a superset of {j,k}; see if they include additional common literals
            cur = create AND gate whose inputs are leaves'
```

```
// an AND gate representing the common subexpression
    refactor leaves' out of roots'
// remove connections between leaves' and each of roots'
    add cur as leaf of roots'
// remove connections between leaves' and each of roots'
    add cur as leaf of roots'          // add cur as an input to each of roots'
    add cur to roots                    // may need to further refactor cur
  }
 }
}
```

When AND/OR elimination module 144 terminates the algorithm above, all common subexpressions will be eliminated from the roots. To complete the process of minimizing the original design (D) netlist 120, reduction tool package 126 replaces the roots in the original design (D) netlist 120 with new logic consistent with the solution obtained in the intermediate representation. The present invention therefore synthesizes all "cur" gates created in the intermediate representation, then re-synthesizes the roots as AND functions over the original roots and the synthesized "cur" gates, to map the solution from the intermediate representation to one in original design (D) netlist 120.

A simple example illustrates the operation of the algorithm above. Assume three roots, such that A1={A, B, C, D} A2={A, B, C, E} A3={A, C, E}. Assume that AND/OR elimination module 144 processes literals in the outer loops in the order A, B, C, D, E. In the first loop, "j" is "A". Roots will be {A1,A2,A3}. Leaves will initially be {A, B, C, E} and will not include D, because that literal occurs only in a single root A1. Reduction tool package 126 then prunes A from leaves. AND/OR elimination module 144 then enters the inner loop, and sets k="B". Roots will be {A1, A2}; leaves will be {A, B, C}. AND/OR elimination module 144 will create a new AND gate A4={A, B, C} and remove those three literals from each of the roots, rendering the roots at the end of the first pass through the inner loop as:
A1={A4, D} A2={A4, E} A3={A, C, E} A4={A, B, C}.

For the second pass through the inner loop, AND/OR elimination module 144 sets k="C". Roots will be {A3, A4}; leaves will be {A, C}. AND/OR elimination module 144 will create a new AND gate A5={A, C}, rendering the roots at the end of the second pass through the inner loop as:
A1={A4, D} A2={A4, E} A3={A5, E} A4={A5, B} A5={A, C}

For the third inner loop AND/OR elimination module 144 sets k="B"; the set of roots is empty, because no remaining roots have {A, B}. Hence AND/OR elimination module 144 continues out of this inner loop. For the fourth and final pass through the inner loop, AND/OR elimination module 144 sets k="E"; the set of roots is again empty since no remaining roots have {A, E}. AND/OR elimination module 144 proceeds to the next pass through the outer loop.

In the next pass through the outer loop, AND/OR elimination module 144 chooses "j"="B". There is only one root with B (which is A4) and, AND/OR elimination module 144 continues to the next pass through the outer loop, and iterates similarly with C and D. For the final loop, the AND/OR elimination module 144 chooses "j"="E", resulting in two roots {A2, A3}. Leaves will only be {E}, because the other literals A4 and A5 in {A2,A3} appear only in a single root. As a result, AND/OR elimination module 144 will not enter the inner loop.

Overall, assuming that AND/OR elimination module 144 started with the above roots A1=A&(B&(C&D)), A2=A& (B&(C&E)), A3=A&(C&E), there are 8 2-input AND expressions. AND/OR elimination module 144 yields A1=A4&D A2=A4&E A3=A5&E A4=A5&B A5=A&C, with only 5 2-input AND expressions.

Extensions to the common AND/OR subexpression elimination algorithm of AND/OR elimination module 144 provide redundancy removal capability. There are several facets to AND/OR elimination module 144 extensions. After queueing the literals in the AND roots in AND/OR elimination module 144, and before creating the intermediate format, AND/OR elimination module 144 prunes the queue in five steps. First, AND/OR elimination module 144 deletes any constant-one gates from the queue. Second, if a constant-zero gate is in the queue, AND/OR elimination module 144 empties the queue and put only a constant-zero gate in the queue. Third, AND/OR elimination module 144 deletes any redundant edges from the queue (i.e., if two edges sourced by the same gate, with the same "inverted" attributes, are in the queue, AND/OR elimination module 144 deletes one of them). This step will ensure that every literal in the queue is unique. Fourth, if any opposite-polarity literals are in the queue, AND/OR elimination module 144 empties the queue and puts only a constant-zero gate in the queue. Finally, if any inverted literal is in the queue, and that literal is an AND root, and the literals of that AND root are all present as literals in the current queue, AND/OR elimination module 144 empties the queue and put only a constant-zero gate in the queue.

Since these queues within AND/OR elimination module 144 represent literals of an AND expression, the steps above are a structural application of propositional "conjunction simplification" rules. If the resulting queue has only a constant-zero literal, then AND/OR elimination module 144 will replace the corresponding root by constant-zero. If the queue has no literals whatsoever, the situation must have arisen due to elimination of constant-one literals, and AND/OR elimination module 144 will replace the corresponding literal by constant-one. Otherwise, AND/OR elimination module 144 uses a hash table to identify the literals of the AND roots. After pruning the queue for a new AND root, AND/OR elimination module 144 checks to see if an AND root with the identical literals exists. If so, AND/OR elimination module 144 replaces the current AND root by the existing one with identical literals. Otherwise, AND/OR elimination module 144 adds the AND root literals to the hash table and proceeds to the next AND root. AND/OR elimination module 144 then proceeds to the common subexpression elimination aspect.

AND/OR synthesis module 146 executes an algorithm to synthesize 3+ input AND gates to minimize gate depth, and/or to retain as much of the original design representation in initial design (D) netlist 120 as possible. When synthesizing 3+ input AND gates into 2-input AND gates for a 2-input AND representation, AND/OR synthesis module 146 may create the set of 2-input AND gates in any possible configuration without risking suboptimality with respect to the total number of gates in the final design. Any non-root gates will be replaced by synthesis of the intermediate representation, which maximally eliminated all common subexpressions from the root expressions. Synthesis of 3+ input AND gates could be an arbitrary cascade (e.g., given a 4-input AND over A, B, C, D, AND/OR synthesis module 146 could form (((A&B)&C)&D)). Alternatively, it is often desired to limit the "depth" of logic levels (i.e., the maximum number of combinational gates that can be traversed through fanin-wise without stopping at a register or primary input). For that reason, a balanced AND tree such as ((A&B)&(C&D)) is often preferred.

Furthermore, rather than arbitrarily pairing literals as in the last example to minimize the depth of the synthesized logic, the AND/OR synthesis module 146 yields even greater reductions in maximum logic depth through the use of a 3-step method. First, AND/OR synthesis module 146 labels each literal in the multi-AND representation with its "depth", where depth is defined such that all constant gates, RANDOM gates, and registers have level 0. The level of other combinational gates is equal to the maximum level of any of their sourcing gates plus one. AND/OR synthesis module 146 then sorts the literals of the 3+ input AND tree by increasing depth in a queue. Finally, while there are 2+ literals in the queue, AND/OR synthesis module 146 removes the two "shallowest" literals and create a 2-input AND over them and add the resulting 2-input AND gate to the queue, again sorting by depth.

Note that AND/OR synthesis module 146 defers creating an AND gate over gates that are already "deep" as long as possible, resulting in a solution where the maximum level of any created AND gate is minimal. When there is only one literal left in the queue, AND/OR synthesis module 146 replaces the root, which was found in initial design (D) netlist 120 with this literal.

Additionally, AND/OR synthesis module 146 may rebuild the AND gates to maximize the amount of reuse of the prior design representation, to in turn minimize the amount of change to the design representation caused by subexpression elimination. Such a criteria may be used as a "tie-breaker" when AND/OR synthesis module 146 is selecting among arbitrary equal-cost solutions (e.g., if more than 2 "shallowest nodes" exist when using the minimum-depth creation algorithm above, AND/OR synthesis module 146 could select those whose conjunctions already exist in the original design); or it could be the only criteria. Assume that AND/OR synthesis module 146 has a "queue" of literals to build an AND tree over, and AND/OR synthesis module 146 will retain as much similarity with the original gates as possible. Again, this priority may relate either to the entire queue that AND/OR synthesis module 146 synthesizes, or to a subset of the queue representing equal-cost solutions for another criteria, such as min-depth above.

AND/OR synthesis module 146 may use an additional method, which is expressed as the algorithm embodied in the following pseudocode:

for each literal A in the queue
   for each AND gate over A in the original cone-of-influence, look at the other AND literal B or NOT B; call the match "C" (which is either B or NOT B)
   if (B is in queue)
   delete A and B from the queue
   add the existing AND gate for (A & B) to the queue XOR/XNOR identification module 152 executes a method for identifying gates of initial design (D) netlist 120 whose functions must be preserved when eliminating common subexpressions within XOR/XNOR trees (referred to as "roots"), which in turn indicate which gates may be replaced by the process of the present invention. XOR/XNOR identification module 152 identifies roots in five steps. First XOR/XNOR identification module 152 labels all pre-defined gates whose functions need to be preserved as roots. For example, in a verification setting, targets (T) 132 and constraints (C) 134 may need to be preserved. In a synthesis setting, "primary outputs" may need to be preserved.

Second, XOR/XNOR identification module 152 marks the "cone of influence" of the pre-defined gates. The cone-of-influence is identified transitively as the set of gates which source incoming edges to this pre-defined set, including next-state functions and initial-value functions for registers. Third, for any register marked as in the cone-of-influence, XOR/XNOR identification module 152 labels its next-state function and initial-value function as roots. Fourth, if initial design (D) netlist 120 does not include a 2-input AND representation, for any non-register gate "g" in the cone-of-influence, XOR/XNOR identification module 152 analyzes all gates that source the incoming edges to "g". If "g" is not an XOR or XNOR gate, XOR/XNOR identification module 152 tags all such source gates as roots. If initial design (D) netlist 120 does include a 2-input AND representation, for every node in the cone of influence, XOR/XNOR identification module 152 uses pattern matching to detect the top AND clause of expressions of the form (NOT(A & NOT B) & NOT(NOT A & B)), which is an XNOR structure, and (NOT(A & B) & NOT(NOT A & NOT B)), which is an XOR structure.

If such a structure is detected, XOR/XNOR identification module 152 labels the internal two AND gates as "xor_internals". Finally, for every XOR/XNOR gate, XOR/XNOR identification module 152 analyzes its fanout gates. If any of the fanout gates are in the cone-of-influence, but not tagged as xor_internals, XOR/XNOR identification module 152 labels them as sinks. As a post-processing step, XOR/XNOR identification module 152 clears the xor_internal flag from any node identified XOR/XNOR root.

XOR/XNOR elimination module 154 executes a heuristically optimal structural algorithm for eliminating common XOR/XNOR subexpressions from roots. XOR/XNOR elimination module 154 exploits the propositional logic fact that ((A XOR B) XNOR C) is equivalent to ((A XNOR B) XOR C), NOT((A XOR B) XOR C) and ((A XOR NOT B) XOR C). Further XOR/XNOR elimination module 154 exploits the propositional logic fact that ((A XNOR B) XNOR C) is equivalent to ((A XOR B) XOR C). This allows XOR/XNOR elimination module 154 to cancel NOTs in pairs, and if any NOT remains, XOR/XNOR elimination module 154 may apply the NOT to the top of the XOR expression.

If initial design (D) netlist 120 does not include a 2-input AND representation, for all XOR/XNOR-gate roots tagged above, XOR/XNOR elimination module 154 traverses fanin-wise exclusively through XOR/XNOR gates and inversions.

XOR/XNOR elimination module 154 maintains an inverted_flag, initialized to false. Any XNOR gate traversed through causes XOR/XNOR elimination module 154 to toggle the inverted_flag, and any inversion present on an edge "between" XOR and XNOR gates causes XOR/XNOR elimination module 154 to toggle the inverted_flag. Finally, XOR/XNOR elimination module 154 queues the UNINVERTED gates sourcing edges at which this traversal stops (i.e., inputs to the terminal XOR/XNOR gates). For each such gate that is inverted, XOR/XNOR elimination module 154 toggles the inverted_flag.

If initial design (D) netlist 120 does include a 2-input AND representation, for all XOR/XNOR-gate roots tagged above, XOR/XNOR elimination module 154 traverses fanin-wise exclusively through XOR/XNOR structures using a get_xor_literals function. For XOR/XNOR gate "g", XOR/XNOR elimination module 154 calls a get_xor_leaves(g, false, literals) function with an empty queue "literals" to get its queue of literals, and its inverted_flag. In a preferred embodiment of XOR/XNOR elimination module 154 the get_xor_leaves(g, false, literals) implements the algorithm embodied in the following pseudocode:

```
xor_type is either NOT_XOR_TYPE
        or   XNOR_TYPE
        or   XOR_TYPE
// the bool return indicates the inverted_flag
bool get_xor_leaves(gate g, bool inverted_edge, queue literals) {
xor_type type bck_xor_type(p, false);
if(type == XNOR_TYPE) {flag = true;)
else           {flag = false;)
if(type == NOT_XOR_TYPE) {
 push(literals, g);
// note - only uninverted literals are pushed. inversions for those are reflected in inverted_flag
//by XNORTYPE and XOR_TYPE processing
 return false;
}else{
inp1 = input_gate_1 (input_gate_1 (g));
inp2 = input_gate_2(input_gate_1 (g));
if(get_xor_leaves(inp1, in put_edge1_is_inverted(input_gate_1 (g)), literals) { flag = NOT flag;
}
if(get_xor_leaves(inp2, input_edge2_is_inverted (input_gate_1 (g)), literals) { flag = NOT flag;
}
)
return flag;
}
xor_type get_xor_type(gate g, bool inverted_edge) {
if(g is a 2-input AND gate) {
   if(input_gate_1 (g) is a 2-input AND gate && //first input gate of "g" is also an AND
   input_gate_2(g) is a 2-input AND gate && //second input gate of "g" is also an AND
   input_edge1_is_inverted(g) &&     //first input edge of "g" is inverted
   input_edge2_is_inverted(g) &&     //first input edge of "g" is inverted
((input_gate_1 (input_gate_1 (g)) == input_gate_1 (input_gate_2(g))) || // source of first input gate
to first child of "g" is
(input_gate_1 (input_gate_1 (g)) == input_gate_2(input_gate_2(g)))) && //also a source of second
child of g
((input_gate_2(input_gate_1(g)) == input_gate_1 (input_gate_2(g))) || //source of second input gate
to first child of "g" is
(input_gate_2(input_gate_1 (g)) == input_gate_2(input_gate_2(g))))) { // also a source of second
child of g
//the present invention now knows this is an XOR or XNOR type
if(input_edge1_is_inverted(input_gate_i (g)) input_edge1_is_inverted(input_gate_1 (g))) {
type = XNOR_TYPE;
}
else{
type = XOR_TYPE;
}
if(!inverted_edge) {return type;}
else if(type == XNOR_TYPE) {return XOR_TYPE;}    // flip type since called on an inverted edge
for gate g
else {return XNOR_TYPE;}// flip type since called on an inverted edge for gate g
}
}
return NOT_XOR_TYPE;
}
```

Any gates traversed "through" by XOR/XNOR elimination module 154 on either traversal, which are not marked as roots, will effectively be replaced by the cross-elimination module 136, as explained later.

XOR/XNOR elimination module 154 will then build an intermediate data structure representing the common subexpression data. XOR/XNOR elimination module 154 ignores any gate not marked in the cone of influence. For any XOR/XNOR gate marked as a root, XOR/XNOR elimination module 154 translates it as a multi-input XOR gate in the intermediate representation whose inputs are the identified leaves. XOR/XNOR elimination module 154 labels the gate with the "inverted_flag", indicating if an even or odd number of inversions were detected. XOR/XNOR elimination module 154 then adds all literals of the multi-input XOR gate, and edges from those literals to the multi-input XOR gate, to the intermediate representation.

Next, XOR/XNOR elimination module 154 eliminates subexpressions from the created data structure in a manner that implements the algorithm embodied in the following pseudocode:

```
for each gate "i" which is a literal of an XOR/XNOR root {
for each polarity of "i" i.e. for each literal "j" involving "i" {
//the present invention will check for instances of "i" as well as "NOT i" in roots
roots = all XOR/XNOR gate roots in the fanout of "j"
//the roots including literal "j" that the present invention may refactor from
if(roots has fewer than two elements) {continue;}
// no subexpression elimination possible with "j"
        leaves = all literals occurring in 2+ roots
```

```
    //the literals that the present invention may refactor out of roots
    leaves = leaves MINUS "j"
    //leaves is now the set of literals that the present invention will try to refactor out of roots,
along with "j"
while(leaves) {
  k = pop(leaves)
//grab another literal; the present invention will try to refactor both "j" and "k" out of roots
roots' = subset of roots containing {j,k}      //see which roots include both "j" and "k"
leaves' = maximal set of common literals in each element of roots'
      //a superset of {j,k}; see if they include additional common literals
roots' has fewer than two elements) {continue;}
//a small optimization - due to adding newly created AND gates as roots below
cur = create XOR gate whose inputs are leaves'
//an XOR gate representing the common subexpression
        refactor leaves' out of roots'
        //remove connections between leaves' and each of roots'
        add cur as a leaf of roots'        //add cur as an input to each of roots'
        add cur to roots                   //may need to further refactor cur
      }
    }
  }
```

When the above algorithm terminates, all common subexpressions will be eliminated from the roots by XOR/XNOR elimination module 154. To complete the process of minimizing initial design (D) netlist 120, XOR/XNOR elimination module 154 replaces the roots found in initial design (D) netlist 120 with new logic consistent with the solution obtained on the intermediate representation. XOR/XNOR elimination module 154 therefore synthesizes all "cur" gates created in the intermediate representation, which will be XOR gates. XOR/XNOR elimination module 154 next re-synthesizes the roots as XOR functions over the original roots and the synthesized 'cur" gates.

Finally, if the "inverted_flag" of the root is not set, XOR/XNOR elimination module 154 replaces the original XOR/XNOR gate with this synthesized XOR gate. Otherwise, XOR/XNOR elimination module 154 replaces the original XOR/XNOR gate with the inversion of the synthesized XOR gate. This step effectively maps the solution from the intermediate representation to one in the original design.

Extensions to XOR/XNOR elimination module 154 can provide redundancy removal capability. After queueing up the literals in the XOR/XNOR roots in and before creating the intermediate format, XOR/XNOR elimination module 154 prunes the queue in three steps. First, XOR/XNOR elimination module 154 deletes any constant-one gates from the queue, and toggles the "inverted_flag" associated with the node. XOR/XNOR elimination module 154 then deletes any constant-zero gates from the queue. If two identical literals are in the queue, XOR/XNOR elimination module 154 deletes them both to ensure that every literal in the queue is unique.

Because these queues represent literals of an XOR expression, the steps above provide a structural application of propositional "conjunction simplification" rules. If the resulting queue is empty, and the "inverted_flag" is false, XOR/XNOR elimination module 154 replaces the corresponding root by constant-zero. If the resulting queue is empty, and the "inverted_flag" is true, XOR/XNOR elimination module 154 replaces the corresponding root by constant-one.

Additionally, XOR/XNOR elimination module 154 uses a hash table to identify the literals of the XOR roots. After pruning the queue for a new XOR root, XOR/XNOR elimination module 154 checks to see if an XOR root with the identical literals exists. If so, and if the "inverted_flags" for the current and matching roots are equal, XOR/XNOR elimination module 154 replaces the current XOR root by the matching one with identical literals. If so, and if the "inverted_flags" for the current and matching roots differ, XOR/XNOR elimination module 154 replaces the current XOR root by the inverse of the matching one with identical literals. Otherwise, XOR/XNOR elimination module 154 adds the XOR root literals to the hash table.

XOR/XNOR synthesis module 156 executes an algorithm to synthesize 3+ input XOR gates to minimize gate depth, and/or to retain as much of the original design representation in initial design (D) netlist 120 as possible. XOR/XNOR synthesis module 156 could perform an arbitrary cascade, (e.g. given a 4-input XOR over A, B, C, D the present invention could form (((A XOR B) XOR C) XOR D))). Alternatively, it is often desired to limit the "depth" of logic levels (i.e., the maximum number of combinational gates that can be traversed through fanin-wise without stopping at a register or primary input. For that reason, a balanced XOR tree such as ((A XOR B) XOR (C XOR D)) is preferred.

Furthermore, rather than arbitrarily pairing literals as in the last example to minimize the depth of the synthesized logic, XOR/XNOR synthesis module 156 yields even greater reductions in maximum logic depth. XOR/XNOR synthesis module 156 performs three steps. First, XOR/XNOR synthesis module 156 labels each literal in the multi-XOR representation with its "depth". Depth is defined where all constant gates, RANDOM gates, and registers have level 0. The level of other combinational gates is equal to the maximum level of any of their sourcing gates plus one. Second, XOR/XNOR synthesis module 156 sorts the literals of the 3+ input XOR tree by increasing depth in a queue. Third, while there are 2+ literals in the queue, XOR/XNOR synthesis module 156 removes the 2 "shallowest" literals and create a 2-input XOR over them (using either of the 2-input AND decompositions for XOR, if desired) and adds the resulting 2-input XOR gate to the queue, again sorting by depth.

Note that XOR/XNOR synthesis module 156 defers creating an XOR gate over gates that are already "deep" as long as possible, resulting in a solution where the maximum level of any created XOR gate is minimal. When there is only one literal left in the queue, XOR/XNOR synthesis module 156 replaces the root in the original netlist with this literal (if its inverted_flag is false), else by the inversion of that literal.

Additionally, XOR/XNOR synthesis module 156 may rebuild the XOR/XNOR gates to maximize the amount of reuse of the prior design representation, to in turn minimize the amount of change to the design representation caused by subexpression elimination. Such a criterion may be used as a "tie-breaker" when selecting among arbitrary equal-cost solutions (e.g., if more than 2 "shallowest nodes" exist when using the min-depth creation algorithm above, the present invention could select those whose conjunctions already exist in the original design); or it could be the only criteria. Assume that XOR/XNOR synthesis module 156 has a "queue" of literals to build an XOR tree over, and XOR/XNOR synthesis module 156 is to retain as much similarity with the original gates as possible. Again, this may either be the entire queue that the present invention is designed to synthesize, or may be a subset of the queue to synthesize representing equal-cost solutions for another criteria, such as min-depth above.

XOR/XNOR synthesis module 156 may also employ an instruction set where, for each literal A in the queue XOR/XNOR synthesis module 156 and for each XOR/XNOR gate over A in the original cone-of-influence, XOR/XNOR synthesis module 156 looks at the other XOR/XNOR literal B or NOT B, and XOR/XNOR synthesis module 156 calls the match "C" (which is either B or NOT B). Note that XOR/XNOR synthesis module 156 may readily identify XOR/XNOR gates over A even in a 2-input AND representation. An appropriate algorithm is embodied in the following pseudocode:

---

(get_xor_type) applied to AND gates which are 2 fanout levels "deeper" than A
    if(B is in queue)
        delete A and B from the queue
        if the existing gate is an XOR, add that existing XOR gate for
    (A XOR B) to the queue
        if the existing gate is an XNOR, add the inverse of that existing
XNOR gate for (A XNOR B) to the queue

---

Cross elimination module 138 executes algorithms to allow subexpression elimination between XOR/XNOR expressions and AND/OR expressions. When building an XOR gate over A and B in a 2-input AND representation, cross elimination module 138 pursues one of two options: NOT(NOT(A & NOT B) & NOT(NOT A & B)) or (NOT(A & B) & NOT(NOT A & NOT B)). Assume that, somewhere in the original design (D) netlist 120, cross elimination module 138 sees an AND gate for (NOT A & B); and no other AND gates over gates A and B exist (save for those to be fabricated for A XOR B). This condition implies that cross elimination module 138 chooses the former synthesis of the XOR, and cross elimination module 138 may reuse one existing AND gate, thereby adding only two for the XOR, whereas the latter would require three dedicated XORs.

When synthesizing a 2+ input XOR in a 2-input AND representation, Cross elimination module 138 attempts to share the resulting AND gates with those in the original structure using the algorithm embodied in the following pseudocode, in which references to "queue" represent the XOR literals to be synthesized:

---

// refactor out pairs which have 2 of the 3 AND gates already in the cone for each literal A in the queue
    for each AND gate over A in the cone-of-influence, which is not an xor_internal, look at the other AND literal B or NOT B; call the match "C" (which is either B or NOT B)
        if(B is in queue)
        if( (NOT A & NOT C) also exists in the cone-of-influence, and is not an xor_internal)
refactor A and B out of queue
        create XOR gate (NOT(A & C) & NOT(NOT A & NOT C)), and add that to the queue
    for each AND gate over NOT A in the cone-of-influence, which is not an xor_internal, look at the other
        AND literal B or NOT B; call the match "C" (which is either B or NOT B)
        if(B is in queue)
        if( (A & NOT C) also exists in the cone-of-influence, and is not an xor_internal) refactor A and B out of queue
        create XOR gate (NOT(NOT A & C) & NOT(A & NOT C)), and add that to the queue
    //refactor out pairs which have 1 of the 3 AND gates already in the cone
    for each AND gate over A in the cone-of-influence, which is not an xor_internal, look at the other AND literal B or NOT B; call the match "C" (which is either B or NOT B)
        if(B is in queue)
        refactor A and B out of queue
        create XOR gate (NOT(A & C) & NOT(NOT A & NOT C)), and add that to the queue
    for each AND gate over NOT A in the cone-of-influence, which is not an xor_internal, look at the other AND literal B or NOT B; call the match "C" (which is either B or NOT B)
        if(B is in queue)
        refactor A and B out of queue
        create XOR gate (NOT(NOT A & C) & NOT(A & NOT C)), and add that to the queue

---

Prevention module 136 executes an algorithm to heuristically prevent logic increases for AND/OR as well as XOR/XNOR refactoring. Though AND/OR elimination module 144 and XOR/XNOR elimination module 154 provide complete elimination of subexpressions, AND/OR elimination module 144 and XOR/XNOR elimination module 154 are heuristic. The order in which common subexpressions including literals "j" and "k" are removed from expressions affects the optimality of the final solution, and may result in an increase in size. Prevention module 136 provides a functionality to attempt to prevent such an increase in size. After building the multi-input AND and XOR representations described above, respectively, and before calling the subexpression elimination code, Prevention module 136 deploys the algorithm embodied in the following pseudocode:

---

For each AND root "g"
    traverse fanin-wise looking for AND roots that were
    "traversed through", and queue these up
    For each element of the queue "h", in order of decreasing number
    of literals in "h":
    if the literals queue for "g" includes all the literals in "h"
        refactor h literals out of "g"
        add h as a literal of "g"

-continued

```
Similarly for XOR roots:
For each multi-input XOR root "g":
traverse fanin-wise looking for XOR roots that were "traversed through,
and queue these up
For each element of the queue "h", in order of decreasing number of
literals in "h":
if the literals queue for "g" includes all the literals in "h"
refactor "h" literals out of "g"
if "h" has its inverted flag as false, add "h" as a literal of "g"
else, add the inversion of "h" as a literal of "g"
```

Prevention module 136 heuristically keeps the final subexpression-eliminated solution closer to that of the original solution, which prevents certain gate increases which may result from the heuristic algorithms AND/OR elimination module 144 and XOR/XNOR elimination module 154.

Reversal module 148 executes an algorithm to selectively undo portions of the subexpression elimination results in reduced design (D') netlist 140, to improve overall reduction capability and/or retain greater similarity with the original design representation in initial design (D) netlist 120. As described in the discussion of Prevention module 136, heuristic algorithms can at times increase design size. Such increases may occur for certain cones of logic, though other cones may attain a reduction through the subexpression elimination. Reversal module 148 provides functionality to selectively undo portions of the subexpression elimination, and retain others.

After application of AND/OR elimination module 144 and XOR/XNOR elimination module 154 have generated an intermediate data structure, reversal module 148 may partition the roots which overlap in literals. Assume every root which contains literal 'A' is in the same partition. For optimality, reversal module 148 places disjoint roots into different partitions. This may be performed by the algorithm embodied in the following pseudocode:

```
partition = 1
for each root "g" {
if(labeled(g)) {continue;}
push(queue, g)
while(queue)
{ h = pop(queue)
label(h) = partition;
for each literal "l" in the literals queue of "h"
for each root "r" in the fanout of "l" {
if(labeled(r)) {continue;}
label(r) = partition
push(queue, r)
}
}
partition++
}
```

Once reversal module 148 has labeled each root in maximally disjoint partitions, reversal module 148 may selectively undo the subexpression elimination results for a given partition. The results of each partition are independent from the others by the construction of the partitioning, hence undoing one partition entails no suboptimality to other partitions.

One significant consideration for undoing the subexpression elimination for a given partition is whether the transformation increases the number of gates necessary to represent the partition. Reversal module 148 may therefore count the number of gates used in the original design to represent the logic of the "traversed through" gates for the given roots in a partition, and compare it to those needed to represent the replacement logic for those roots. If the former is less than, or possibly equal to/within a specific threshold of being equal to (e.g., if the reversal module 148 attempts to retain as much of the original design representation as possible), the latter, reversal module 148 may neglect the replacement of the original gates. Numerous other criteria for neglecting the replacement may be selected, such as choosing based upon gate depth, or any other criteria.

Figure 2:
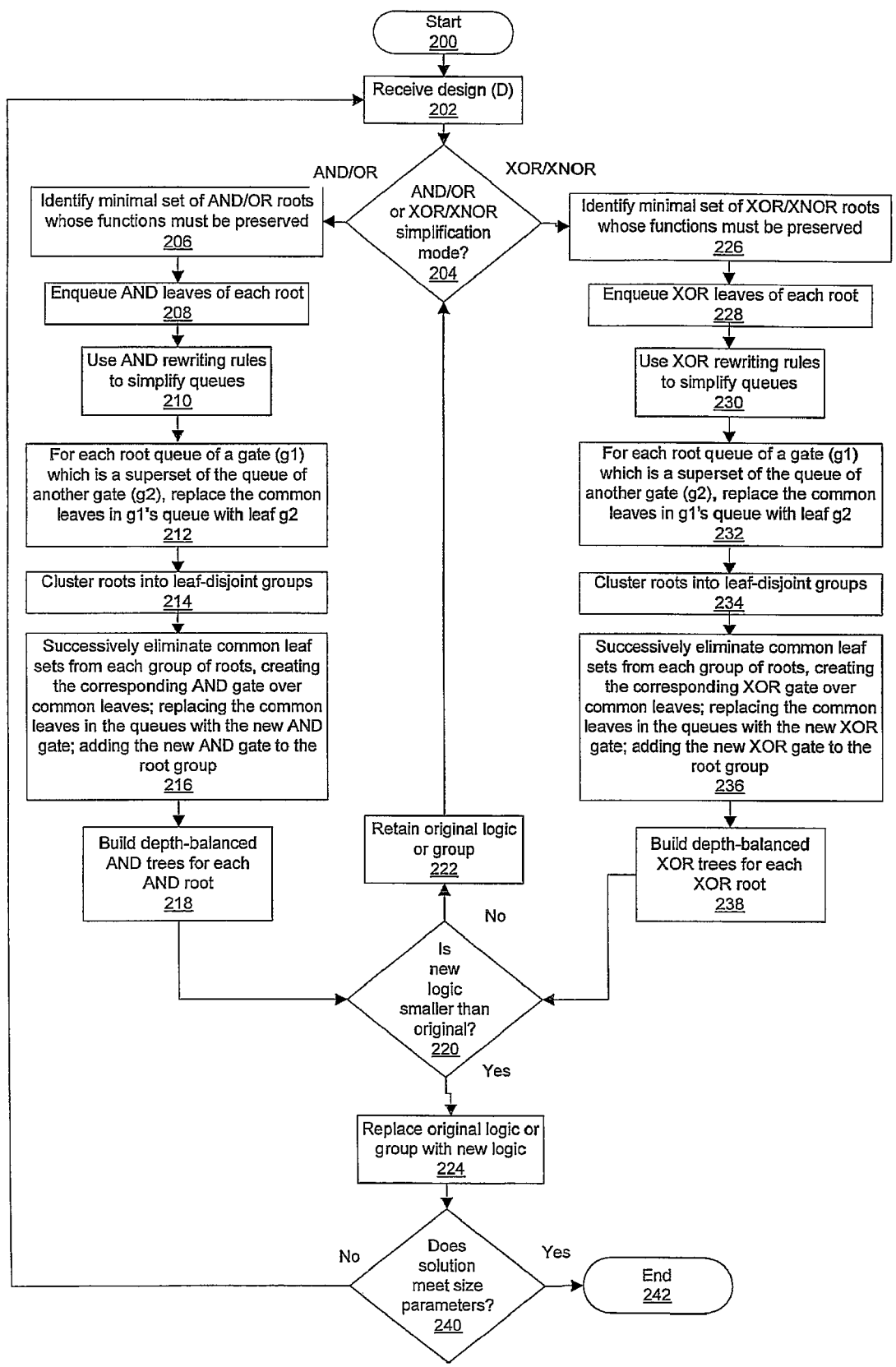
FIG. 2 is a high-level logical flowchart of a process for performing reduction of subexpressions in structural design representations containing XOR and XNOR gates.

Referring now to FIG. 2, a high-level logical flowchart of a method for heuristic elimination of sub-expressions instructional design representations is depicted. The process starts at step 200 and then proceeds to step 202, which depicts verification environment 124 receiving initial design (D) netlist 120. The process next moves to step 204. At step 204, reduction tool package 126 determines whether to use whether to use XOR/XNOR or AND/OR simplification. The choice of what form of simplification is to be used can be based on any number of criteria, ranging from alternating between passes to performing mathematical computations with respect to initial design (D) netlist 120. If AND/OR simplification is chosen, then the process passes to step 206, which depicts AND/OR identification module 142 identifying a minimal set of AND/OR roots whose functions must be preserved. The process then moves to step 208. At step 208, reduction tool package 126 enqueues AND leaves of each root from initial design (D) netlist 120.

The process then proceeds to step 210, which depicts AND/OR elimination module 144 using AND rewriting rules to simplify queues. The process next moves to step 212. At step 212, for each root queue of a gate (g1) which is a superset of the queue of another gate (g2), AND/OR elimination module 144 replaces the common leaves in g1's queue with leaf g2.

The process then proceeds to step 214, which depicts AND/OR elimination module 144 clustering roots into leaf-disjoint groups. Next, the process proceeds to step 216. At step 216, AND/OR elimination module 144 successively eliminates common leaf sets from each corresponding group of roots creating the corresponding AND gates over common leaves and replacing the common leaves in queues with the new AND gate. AND/OR elimination module 144 also adds the new AND gate to the root group. The process then moves to step 218, which depicts prevention module 136 and cross elimination module 138 building depth-balanced AND trees for each AND root. The process then proceeds to step 220.

At step 220, reduction tool package 126 determines whether the new logic created in steps 206 to 218 or steps 226 to 238 is smaller than the original logic of initial design (D) netlist 120 received in step 202. If the new logic created in steps 206 to 218 or steps 226 to 238 is not smaller than the original logic of initial design (D) netlist 120 received in step 212, then the process moves to step 222, which depicts reversal module 148 retaining the original logic or group received in initial design (D) netlist 120 at step 202. The process returns to step 204, which is described above. If reduction tool package 126 determines that the new logic created in steps 206 to 218 or steps 226 to 238 is smaller than the original logic received in initial design (D) netlist 120 at step 202, then the process proceeds to step 224. Step 224 depicts reduction tool package 126 replacing the original logic received in initial design (D) netlist 120 at step 202 with the new logic created in steps 206 to 218 or steps 226 to 238. The process then proceeds to step 240.

At step 240, reduction tool package 126 determines whether the current solution of initial design (D) netlist 120 as modified through steps 206 to 218 or steps 226 to 238 meets the required size parameters for the current verification problem. If reduction tool package 126 determines that the current solution meets the size parameters for the current verification problem then the process ends at step 242, at which point results are reported to output table 122. If reduction tool package 126 determines that the current solution constructed in steps 206 to 218 or steps 226 to 238 does not meet the sized parameters of the current verification problem then the process returns to step 202 which is described above.

Returning to step 226, which depicts verification environment 124 identifying a minimal set of XOR/XNOR roots whose functions must be preserved. The process then moves to step 228, at step 228, reduction tool package 126 enqueues XOR leaves of each root from initial design (D) netlist 120. The process then proceeds to step 230, which depicts verification environment 124 using XOR rewriting rules to simplify queues. The process next moves to step 232. At step 232, for each root queue of a gate (g1) which is a superset of the queue of another gate (g2), verification environment 124 replaces the common leaves in g1's queue with leaf g2.

The process then proceeds to step 234, which depicts XOR/XNOR elimination module 154 clustering roots into leaf-disjoint groups. Next, the process proceeds to step 236. At step 236, verification environment 124 successively eliminates common leaf sets from each corresponding group of roots creating the corresponding XOR gates over common leaves and replacing the common leaves in queues with the new XOR gate. Verification environment 124 also adds the new XOR gate to the root group. The process then moves to step 238, which depicts verification environment 124 building depth-balanced XOR trees for each XOR root. The process then proceeds to step 220.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A computer program product for reducing subexpressions in structural design representations, said computer program product comprising:
   a computer-readable storage medium; and
   instructions on the computer-readable storage medium that, when executed by a computer, cause the computer to perform:
      receiving an initial design, wherein said initial design represents an electronic circuit containing an XOR gate;
      selecting a first simplification mode for said initial design from a set of multiple different simplification modes, wherein said first simplification mode is an XOR/XNOR simplification mode;
      simplifying said initial design according to said first simplification mode to generate a reduced design containing a reduced number of XOR gates;
      determining whether a size of said reduced design is less than a size of said initial design;
      in response to determining that said size of said reduced design is less than said size of said initial design, replacing said initial design with said reduced design; and
      achieving a final reduced design and storing the final reduced design in data storage of the computer.

2. The computer program product of claim 1, wherein the instructions further cause the computer to perform:
   in response to determining that said size of said reduced design is not less than said size of said initial design:
      selecting a second simplification mode for said initial design from the set of multiple different simplification modes; and
      simplifying said initial design according to said second simplification mode to generate a reduced design.

3. The computer program product of claim 2, wherein the set of multiple different simplification modes is composed of an AND/OR simplification mode and an XOR/XNOR simplification mode.

4. The computer program product of claim 2, wherein said simplifying said initial design according to said second simplification mode includes:
   identifying a minimal set of one or more roots, wherein said one or more roots represent one or more functions requiring preservation;
   enqueuing in one or more root queues one or more leaves of each of said one or more roots;
   using a set of rewriting rules to simplify said one or more root queues;
   for each one or more roots in said one or more root queues, replacing one or more common leaves in said root queue of a first gate with a second gate, wherein said first gate is a superset of said second gate;
   clustering said one or more roots into one or more leaf-disjoint groups;
   successively eliminating one or more common leaf sets from each of said one or more root queues;
   creating corresponding gates over said common leaf sets;
   replacing common leaves in said root queues with new gates, thus resulting in adding said new gates to said root queues; and
   building one or more depth-balanced trees for each root.

5. The computer program product of claim 1, wherein said simplifying said initial design according to said first simplification mode includes:
   identifying a minimal set of one or more roots, wherein said one or more roots represent one or more functions requiring preservation;
   enqueuing in one or more root queues one or more leaves of each of said one or more roots;
   using a set of rewriting rules to simplify said one or more root queues;
   for each one or more roots in said one or more root queues, replacing one or more common leaves in said root queue of said XOR gate with a second gate, wherein said XOR gate is a superset of said second gate;
   clustering said one or more roots into one or more leaf-disjoint groups;
   successively eliminating one or more common leaf sets from each of said one or more root queues;
   creating corresponding gates over said common leaf sets;
   replacing common leaves in said root queues with new gates, thus resulting in adding said new gates to said root queues; and
   building one or more depth-balanced trees for each root.

6. The computer program product of claim 5, wherein:
identifying a minimal set of one or more roots further comprises identifying a minimal set of one or more XOR/XNOR roots, wherein said one or more roots represent one or more functions requiring preservation;
enqueuing in one or more root queues one or more leaves of each of said one or more roots further comprises enqueuing in one or more root queues one or more XOR leaves of each of said one or more roots;
creating corresponding gates over said common leaf sets further comprises creating corresponding XOR gates over said common leaf sets;
replacing common leaves in said root queues with new gates further comprises replacing common leaves in said root queues with new XOR gates;
adding said new gates to said root queues further comprises adding said new XOR gates to said root queues; and
building one or more depth-balanced trees for each root further comprises building one or more depth-balanced XOR trees for each XOR root.

7. A data processing system, comprising:
a processor;
data storage coupled to the processor; and
instructions stored within the data storage and executable by the processor, wherein the instructions, when executed by the processor, cause the data processing system to perform:
receiving an initial design, wherein said initial design represents an electronic circuit containing an XOR gate;
selecting a first simplification mode for said initial design from a set of multiple different simplification modes, wherein said first simplification mode is an XOR/XNOR simplification mode;
simplifying said initial design according to said first simplification mode to generate a reduced design containing a reduced number of XOR gates;
determining whether a size of said reduced design is less than a size of said initial design;
in response to determining that said size of said reduced design is less than said size of said initial design, replacing said initial design with said reduced design; and
achieving a final reduced design and storing the final reduced design in data storage of the computer.

8. The data processing system of claim 7, wherein the instructions further cause the data processing system to perform:
in response to determining that said size of said reduced design is not less than said size of said initial design:
selecting a second simplification mode for said initial design from the set of multiple different simplification modes; and
simplifying said initial design according to said second simplification mode to generate a reduced design.

9. The data processing system of claim 8, wherein the set of multiple different simplification modes is composed of an AND/OR simplification mode and an XOR/XNOR simplification mode.

10. The data processing system of claim 8, wherein said simplifying said initial design according to said second simplification mode includes:
identifying a minimal set of one or more roots, wherein said one or more roots represent one or more functions requiring preservation;
enqueuing in one or more root queues one or more leaves of each of said one or more roots;
using a set of rewriting rules to simplify said one or more root queues;
for each one or more roots in said one or more root queues, replacing one or more common leaves in said root queue of a first gate with a second gate, wherein said first gate is a superset of said second gate;
clustering said one or more roots into one or more leaf-disjoint groups;
successively eliminating one or more common leaf sets from each of said one or more root queues;
creating corresponding gates over said common leaf sets;
replacing common leaves in said root queues with new gates, thus resulting in adding said new gates to said root queues; and
building one or more depth-balanced trees for each root.

11. The data processing system of claim 7, wherein said simplifying said initial design according to said first simplification mode includes:
identifying a minimal set of one or more roots, wherein said one or more roots represent one or more functions requiring preservation;
enqueuing in one or more root queues one or more leaves of each of said one or more roots;
using a set of rewriting rules to simplify said one or more root queues;
for each one or more roots in said one or more root queues, replacing one or more common leaves in said root queue of said XOR gate with a second gate, wherein said XOR gate is a superset of said second gate;
clustering said one or more roots into one or more leaf-disjoint groups;
successively eliminating one or more common leaf sets from each of said one or more root queues;
creating corresponding gates over said common leaf sets;
replacing common leaves in said root queues with new gates, thus resulting in adding said new gates to said root queues; and
building one or more depth-balanced trees for each root.

12. The data processing system of claim 11, wherein:
identifying a minimal set of one or more roots further comprises identifying a minimal set of one or more XOR/XNOR roots, wherein said one or more roots represent one or more functions requiring preservation;
enqueuing in one or more root queues one or more leaves of each of said one or more roots further comprises enqueuing in one or more root queues one or more XOR leaves of each of said one or more roots;
creating corresponding gates over said common leaf sets further comprises creating corresponding XOR gates over said common leaf sets;
replacing common leaves in said root queues with new gates further comprises replacing common leaves in said root queues with new XOR gates;
adding said new gates to said root queues further comprises adding said new XOR gates to said root queues; and
building one or more depth-balanced trees for each root further comprises building one or more depth-balanced XOR trees for each XOR root.

13. A method of data processing system, comprising:
in response to receiving an initial design, said initial design representing an electronic circuit containing an XOR gate, a data processing system:
selecting a first simplification mode for said initial design from a set of multiple different simplification modes, wherein said first simplification mode is an XOR/XNOR simplification mode;
simplifying said initial design according to said first simplification mode to generate a reduced design containing a reduced number of XOR gates;
determining whether a size of said reduced design is less than a size of said initial design;

in response to determining that said size of said reduced design is less than said size of said initial design, replacing said initial design with said reduced design; and achieving a final reduced design and storing the final reduced design in data storage of the data processing system.

14. The method of claim 13, and further comprising:

in response to determining that said size of said reduced design is not less than said size of said initial design, the data processing system:

selecting a second simplification mode for said initial design from the set of multiple different simplification modes; and simplifying said initial design according to said second simplification mode to generate a reduced design.

15. The method of claim 14, wherein the set of multiple different simplification modes is composed of an AND/OR simplification mode and an XOR/XNOR simplification mode.

16. The method of claim 14, wherein said simplifying said initial design according to said second simplification mode includes:

identifying a minimal set of one or more roots, wherein said one or more roots represent one or more functions requiring preservation;

enqueuing in one or more root queues one or more leaves of each of said one or more roots;

using a set of rewriting rules to simplify said one or more root queues;

for each one or more roots in said one or more root queues, replacing one or more common leaves in said root queue of a first gate with a second gate, wherein said first gate is a superset of said second gate;

clustering said one or more roots into one or more leaf-disjoint groups;

successively eliminating one or more common leaf sets from each of said one or more root queues;

creating corresponding gates over said common leaf sets;

replacing common leaves in said root queues with new gates, thus resulting in adding said new gates to said root queues; and building one or more depth-balanced trees for each root.

17. The method of claim 13, wherein said simplifying said initial design according to said first simplification mode includes:

identifying a minimal set of one or more roots, wherein said one or more roots represent one or more functions requiring preservation;

enqueuing in one or more root queues one or more leaves of each of said one or more roots;

using a set of rewriting rules to simplify said one or more root queues;

for each one or more roots in said one or more root queues, replacing one or more common leaves in said root queue of said XOR gate with a second gate, wherein said XOR gate is a superset of said second gate;

clustering said one or more roots into one or more leaf-disjoint groups;

successively eliminating one or more common leaf sets from each of said one or more root queues;

creating corresponding gates over said common leaf sets;

replacing common leaves in said root queues with new gates, thus resulting in adding said new gates to said root queues; and building one or more depth-balanced trees for each root.

18. The method of claim 17, wherein:

identifying a minimal set of one or more roots further comprises identifying a minimal set of one or more XOR/XNOR roots, wherein said one or more roots represent one or more functions requiring preservation;

enqueuing in one or more root queues one or more leaves of each of said one or more roots further comprises enqueuing in one or more root queues one or more XOR leaves of each of said one or more roots;

creating corresponding gates over said common leaf sets further comprises creating corresponding XOR gates over said common leaf sets;

replacing common leaves in said root queues with new gates further comprises replacing common leaves in said root queues with new XOR gates;

adding said new gates to said root queues further comprises adding said new XOR gates to said root queues; and building one or more depth-balanced trees for each root further comprises building one or more depth-balanced XOR trees for each XOR root.

* * * * *